(12) United States Patent
Park et al.

(10) Patent No.: US 8,685,865 B2
(45) Date of Patent: Apr. 1, 2014

(54) METHOD OF FORMING PATTERNS OF SEMICONDUCTOR DEVICE

(75) Inventors: Jeong-ju Park, Gyeonggi-do (KR);
Kyoung-mi Kim, Gyeonggi-do (KR);
Min-jung Kim, Gyeonggi-do (KR);
Dong-jun Lee, Seoul (KR); Boo-deuk Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2 days.

(21) Appl. No.: 13/608,403

(22) Filed: Sep. 10, 2012

(65) Prior Publication Data

US 2013/0089986 A1 Apr. 11, 2013

(30) Foreign Application Priority Data

Oct. 11, 2011 (KR) .................. 10-2011-0103601

(51) Int. Cl.
*H01L 21/32* (2006.01)
*G03F 7/20* (2006.01)

(52) U.S. Cl.
USPC ........... 438/781; 438/780; 430/322; 430/394; 257/E21.259

(58) Field of Classification Search
USPC .............. 438/780, 781; 430/322, 394
See application file for complete search history.

(56) References Cited

U.S. PATENT DOCUMENTS

| | | | |
|---|---|---|---|
| 6,395,451 B1* | 5/2002 | Jung et al. | 430/270.1 |
| 2007/0264598 A1* | 11/2007 | Chang et al. | 430/322 |
| 2009/0123867 A1* | 5/2009 | Yuba et al. | 430/270.1 |
| 2010/0062378 A1* | 3/2010 | Choki et al. | 430/321 |
| 2011/0097668 A1* | 4/2011 | Lawson et al. | 430/280.1 |
| 2013/0216952 A1* | 8/2013 | Yokoyama et al. | 430/286.1 |

FOREIGN PATENT DOCUMENTS

| | | |
|---|---|---|
| JP | 2008-159874 | 7/2008 |
| JP | 2010-040849 | 2/2010 |
| KR | 10-2009-0001079 A | 1/2009 |
| KR | 10-2010-0102189 | 9/2010 |

* cited by examiner

*Primary Examiner* — Alexander Ghyka
(74) *Attorney, Agent, or Firm* — Lee & Morse, P.C.

(57) ABSTRACT

A method of forming patterns of a semiconductor device may include forming a photoresist layer that includes a photo acid generator (PAG) and a photo base generator (PBG), generating an acid from the PAG in a first exposed portion of the photoresist layer by first-exposing the photoresist layer, and generating a base from the PBG in a second exposed portion of the photoresist layer by second-exposing a part of the first exposed portion and neutralizing the acid. The method may also include baking the photoresist layer after the first and second-exposing and deblocking the photoresist layer of the first exposed portion in which the acid is generated to form a deblocked photoresist layer, and forming a photoresist pattern by removing the deblocked photoresist layer by using a developer.

20 Claims, 12 Drawing Sheets

_US 8,685,865 B2_

METHOD OF FORMING PATTERNS OF SEMICONDUCTOR DEVICE

CROSS-REFERENCE TO RELATED APPLICATION

Korean Patent Application No. 10-2011-0103601, filed on Oct. 11, 2011, in the Korean Intellectual Property Office, and entitled "Method of Forming Patterns of Semiconductor Device," is incorporated by reference herein in its entirety.

BACKGROUND

1. Field

Embodiments relate to a method of manufacturing a semiconductor device, and to a method of forming patterns of a semiconductor device.

2. Description of the Related Art

Due to the reduction of the design rules for semiconductor devices, sizes of patterns in semiconductor devices are also being be reduced. However, a photolithography process has resolution limits in embodying minute patterns of the semiconductor devices. Accordingly, a double patterning technology (DPT) is being studied for forming minute patterns of the semiconductor devices.

SUMMARY

Embodiments may be realized by providing a method of forming patterns of a semiconductor device, the method includes forming a photoresist layer on a substrate that includes a photo acid generator (PAG) and a photo base generator (PBG), generating an acid from the PAG in a first exposed portion of the photoresist layer by first-exposing the photoresist layer, generating a base from the PBG in a second exposed portion of the photoresist layer by second-exposing a part of the first exposed portion and neutralizing the acid, baking the photoresist layer after the first and second-exposing and deblocking the photoresist layer of the first exposed portion in which the acid is generated to form a deblocked photoresist layer, and forming a photoresist pattern by removing the deblocked photoresist layer by using a developer.

The first-exposing and the second-exposing may be performed by using a first mask and a second mask, respectively, having line-and-space patterns. The photoresist pattern may be formed as another line and-space pattern. Space patterns of the first mask and the second mask may be portions through which light passes when the first exposing and the second-exposing are performed.

A width of a line pattern of the second mask may be greater than a width of a line pattern of the first mask. A width of a space pattern of the second mask may be less than a width of a space pattern of the first mask. The first-exposing may be performed by using a first mask having a line-and-space pattern extending along a first direction. The second-exposing may be performed by using a second mask having a line-and-space pattern extending along a second direction that is perpendicular to the first direction. The photoresist pattern may be formed as a contact hole pattern.

The first-exposing may be performed as a blank exposure in which an entire surface of the photoresist layer formed on the substrate is exposed. The second-exposing may be performed by using a bright field mask having a contact hole mask pattern. The photoresist pattern may be formed as a contact hole pattern. The second-exposing may be performed by using a bright field mask having a trench pattern. The photoresist pattern may be formed as a trench pattern.

The photoresist layer may include a positive-type photoresist layer. The developer used for forming the photoresist pattern may be a base developer such that the photoresist layer of the first exposed portion in which the acid is generated may be removed. The first-exposing may be performed at a first exposure dose, and the second-exposing may be performed at a second exposure dose that is greater than the first exposure dose.

Embodiments may be realized by providing a method of forming patterns of a semiconductor device that includes forming an etching target layer on a substrate, forming a photoresist layer on the etching target layer that includes a photo acid generator (PAG) and a photo base generator (PBG), generating an acid from the PAG in a first exposed portion of the photoresist layer by first-exposing the photoresist layer and forming first photoresist image patterns in a non-exposed portion of the photoresist layer, forming second photoresist image patterns by generating a base from the PBG in a second exposed portion by second-exposing a part of the first exposed portion, and neutralizing the acid, baking the first and second-exposed photoresist layer and deblocking the photoresist layer of the first exposed portion in which the acid is generated to form a deblocked photoresist layer, forming a photoresist pattern including the first photoresist image patterns and the second photoresist image patterns by removing the deblocked photoresist layer by using a developer, and etching the etching target layer by using the photoresist pattern as a mask.

The first-exposing may be performed at a first exposure dose. The second-exposing may be performed at a second exposure dose that is greater than the first exposure dose. The photoresist layer may be formed as a positive-type photoresist layer. The developer used for forming the photoresist pattern may be a base developer such that the deblocked photoresist layer is removed by using the base developer.

The first photoresist image patterns may be formed having a pitch P by performing the first-exposing by using a first mask having a first line-and-space pattern. The second photoresist image patterns may be formed having the pitch P in the first photoresist image patterns by performing the second-exposing by using a second mask having a second line-and-space pattern. The photoresist pattern may be formed as a third line-and-space pattern having half a pitch P.

The first-exposing may be performed by using a first mask having a line-and-space pattern extending along a first direction. The second-exposing may be performed by using a second mask having another line-and-space pattern extending along a second direction that is perpendicular to the first direction. The photoresist pattern may be formed as a contact hole pattern.

Embodiments may also be realized by providing a method of forming patterns of a semiconductor device that includes providing a photoresist layer including a photo acid generator (PAG) and a photo base generator (PBG), performing a first exposure operation on the photoresist layer to generate an acid in a first exposed portion of the photoresist layer, performing a second exposure operation on the photoresist layer to generate a base in a second exposed portion within the first exposed portion of the photoresist layer, the acid in the second exposed portion being neutralized during the second exposure operation, baking the photoresist layer after performing the first and second exposure operations to form a deblocked photoresist layer within the first exposed portion and adjacent to the second exposed portion, and removing the deblocked photoresist layer.

The second exposed portion may be formed within a central portion of the first exposed portion and the deblocked photoresist layer may be formed on opposing sides of the second exposed portion within the first exposed portion. Removing the deblocked photoresist layer may include using a base developer that includes tetramethylammonium hydroxide.

Performing the first exposure operation may include using a first mask that overlaps a first non-exposed portion of the photoresist layer and performing the second exposure operation includes using a second mask that overlaps a second non-exposed portion of the photoresist layer. The second non-exposed portion may be larger than the first non exposed portion. After removing the deblocked photoresist layer, the first non-exposed portion of the photoresist layer and the second exposed portion of the photoresist layer may remain.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
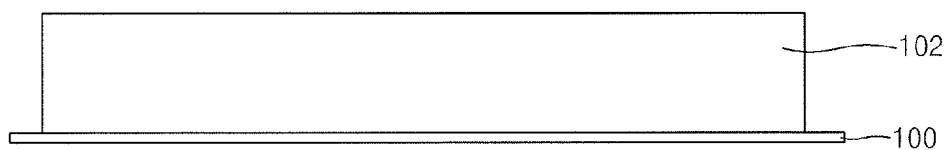
FIGS. 1 through 4 illustrate cross-sectional views depicting stages in a method of forming patterns of a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, it will also be understood that when an element such as layer, region, substrate, or chip is referred to as being "connected to" or "coupled with" another element, it can be directly connected to or coupled with the other element, or intervening elements may also be present. However, when an element is referred to as being "directly connected to" or "directly coupled with" another element, it will be understood that there are no intervening elements. Throughout the specification, a term "and/or" includes at least one from among all listed components and one or more combinations of all listed components.

While terms "first" and "second" are used to describe various components, parts, regions, layers and/or portions, it is obvious that the components, parts, regions, layers and/or portions are not limited to the terms "first" and "second". The terms "first" and "second" are used only to distinguish between each of components, each of parts, each of regions, each of layers and/or each of portions. Thus, throughout the specification, a first component, a first part, a first region, a first layer or a first portion may indicate a second component, a second part, a second region, a second layer or a second portion without having a conflict thereof.

In addition, relative terms such as "lower" or "bottom", and "upper" or "top" may be used to describe relationship between elements as illustrated in the drawings. These relative terms can be understood to include different directions in addition to the described directions illustrated in the drawings. For example, when elements are turned over in the drawings, elements described to be on lower surfaces of other elements are formed on upper surfaces of the other elements. Therefore, the term "lower" depends only on a predetermined direction and can include both "upper" and "lower" directions. Similarly, when a device is turned over in one of the drawings, elements which are described to be "below or beneath" some other elements are then "above" of the other elements. Accordingly, the term "below" can include both directions "above and below."

Examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operations, a component, and/or groups thereof, not excluding the existence of one or more other recited forms, one or more other numbers, one or more other processes, one or more other operations, one or more other components and/or groups thereof.

In the drawing figures, the dimensions of layers and regions may be exaggerated for clarity of illustration. With respect to the drawings, shapes in the drawings may be revised according to, e.g., a manufacturing technology and/or a tolerance. Therefore, the attached drawings for illustrating exemplary embodiments are referred to in order to gain a sufficient understanding of the disclosure, the merits thereof, the implementation thereof.

Expressions such as "at least one of," when preceding a list of elements, modify the entire list of elements and do not modify the individual elements of the list.

FIGS. 1 through 4 are cross-sectional views depicting stages in a method of forming patterns of a semiconductor device, according to an exemplary embodiment. FIG. 5 is a flowchart of the method of forming patterns of a semiconductor device, according to the exemplary embodiment. FIGS. 6 and 7 are plan views illustrating masks of FIGS. 2 and 3, respectively, which may be used in exposure operations.

Referring to FIGS. 1 and 5, a photoresist layer 102 may be formed on a semiconductor substrate 100 (operation S10 in FIG. 5). The semiconductor substrate 100 may include a group IV semiconductor substrate, a group III-V compound semiconductor substrate, or a group II-VI oxide semiconductor substrate. For example, the group IV semiconductor substrate may include a silicon substrate, a germanium substrate, or a silicon-germanium substrate. The semiconductor substrate 100 may include a bulk wafer or an epitaxial layer. In the present embodiment, the semiconductor substrate 100 may include active regions, isolation layers, a conductive layer, an insulating layer, and the like in its upper portion.

The photoresist layer 102 may be a positive-type photoresist layer having higher resolution than that of a negative-type photoresist layer. The photoresist layer 102 may be a chemically amplified photoresist layer. The photoresist layer 102 may be a photoresist layer configured for a KrF excimer laser (e.g., with a wavelength of about 248 nm), a photoresist layer configured for an ArF excimer laser (e.g., with a wavelength of about 193 nm), a photoresist layer configured for a $F_2$ excimer laser (e.g., with a wavelength of about 157 nm), or a photoresist layer configured for an extreme ultraviolet (EUV) excimer laser (e.g., with a wavelength of about 13.5 nm). However, embodiments are not limited thereto, e.g., the photoresist layer 102 may be for a photoresist layer configured for other types of lasers and/or other wavelengths.

The photoresist layer 102 may include a photo acid generator (PAG) and a photo base generator (PBG). Both the PAG and the PBG may be materials contained within the photoresist layer 102, e.g., forming the photoresist layer 102. The PAG has a high luminescent efficiency so as to generate an acid at a low exposure dose. The PBG has a lower luminescent efficiency than the PAG so as to generate a base at a high exposure dose. The PAG and PBG may be dispersed throughout, e.g., completely throughout, a base material of the photoresist layer 102.

According to an exemplary embodiment, a (meth)acrylate-based polymer may be used as the photoresist layer 102, e.g., as the base material of the photoresist layer 102. The (meth)acrylate-based polymer may be, e.g., an aliphatic (meth)acrylate-based polymer. For example, the (meth)acrylate-based polymer may be a poly(methyl methacrylate) (PMMA), a poly(t-butyl methacrylate), a poly(methacrylic acid)), a poly (norbornyl methacrylate), di- or tri-copolymers of repeating units of the (meth)acrylate-based polymers, or a mixture thereof.

The PAG may generate an acid by being exposed to at least one of a KrF excimer laser (e.g., with a wavelength of about 248 nm), an ArF excimer laser (e.g., with a wavelength of about 193 nm), a $F_2$ excimer laser (e.g., with a wavelength of about 157 nm), and an EUV excimer laser (e.g., with a wavelength of about 13.5 nm). For example, the PAG may include at least one selected from a group of an onium salt, a halogen compound, nitrobenzyl esters, alkyl sulfonates, diazonaphthoquinones, imino sulfonates, disulfones, diazomethanes, sulfonyloxyketones, and the like.

The PBG may generate a base by being exposed to at least one of a KrF excimer laser (e.g., with a wavelength of about 248 nm), an ArF excimer laser (e.g., with a wavelength of about 193 nm), a $F_2$ excimer laser (e.g., with a wavelength of about 157 nm), and an EUV excimer laser (e.g., with a wavelength of about 13.5 nm). The PBG may include at least one selected from a group of a carbamate-based compound, a benzyloxycarbonyl-based compound, an O-acyloxime-based compound, and the like.

Figure 2:
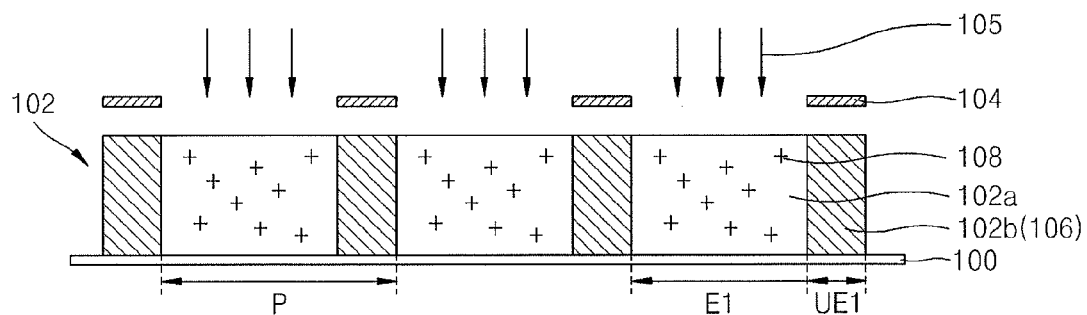

Referring to FIGS. 2, 5, and 6, a first exposure may be performed by irradiating light 105 onto the photoresist layer 102 by using a first mask 104 (operation S30 in FIG. 5). The light 105 used in the first exposure may be a KrF excimer laser (e.g., with a wavelength of about 248 nm), an ArF excimer laser (e.g., with a wavelength of about 193 nm), a $F_2$ excimer laser (e.g., with a wavelength of about 157 nm), or an EUV excimer laser (e.g., with a wavelength of about 13.5 nm), according to an exemplary embodiment. The first exposure may be performed at a first exposure dose, e.g., in several millijoule (mJ) to several tens of mJ. The first exposure dose may be performed within a range of about 5 to about 90 mJ.

During the first exposure, the photoresist layer 102 may be divided into a first exposed portion E1 and a first non-exposed portion UE1. For example, the photoresist layer 102 may be divided into a plurality of first exposed portions E1 and a plurality of first non-exposed portions UE1 by the placement of a first mask 104, e.g., as illustrated in FIG. 2. Due to the first exposure, the photoresist layer 102 may be divided into a photoresist layer portions 102a and 102b which correspond to the first exposed portion E1 and the first non-exposed portion UE1, respectively. For example, due to the first exposure, an acid 108 may be generated from the PAG in the photoresist layer portion 102a of the first exposed portion E1, e.g., the acid 108 may be generated only in the first exposed portions E1. Since the first non-exposed portion UE1 is not exposed, an acid may not be generated in the non-exposed portions UE1, e.g., the acid 108 is excluded in the non-exposed portions UE1.

Due to the first exposure, the photoresist layer portion 102b of the first non-exposed portion UE1 may become base-insoluble. Accordingly, the photoresist layer portion 102b may be formed as first photoresist image patterns 106 that are not removed even after a post process, e.g., may not be removed during a subsequent pattern developing process. The first photoresist image patterns 106 may be formed to have a pitch P. The pitch P of the first photoresist image patterns 106 may be a minimum pitch that may be formed by an exposing apparatus.

As illustrated in FIG. 6, the first mask 104 may have a line-and-space pattern having a line pattern L and a space pattern S alternately arranged along a first direction, e.g., in an X-axis direction. Each of the line patterns L and space patterns S may be continuously formed in the Y-axis direction so as to be elongated along the Y-axis direction. A width ratio, e.g., the width being measured along the X-axis direction, of a line pattern L and a space pattern S may be about 1:3. During the first exposure using the first mask 104, the line pattern L indicates a portion through which the light 105 does not pass therethrough, and the space pattern S indicates a portion through which the light 105 passes therethrough.

Figure 3:
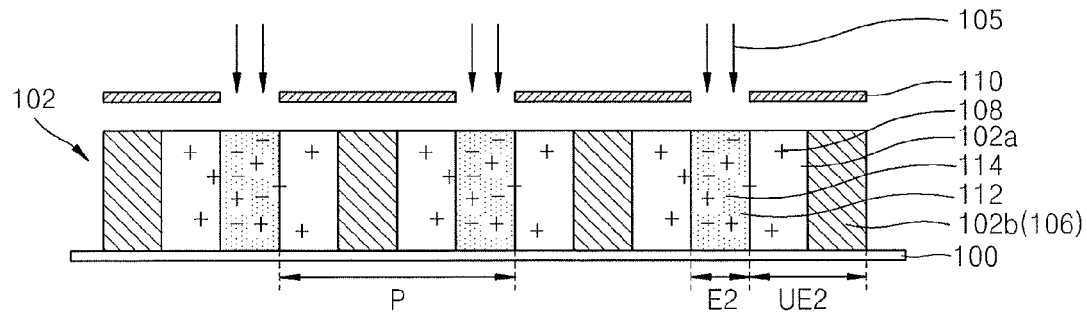
Figure 7:
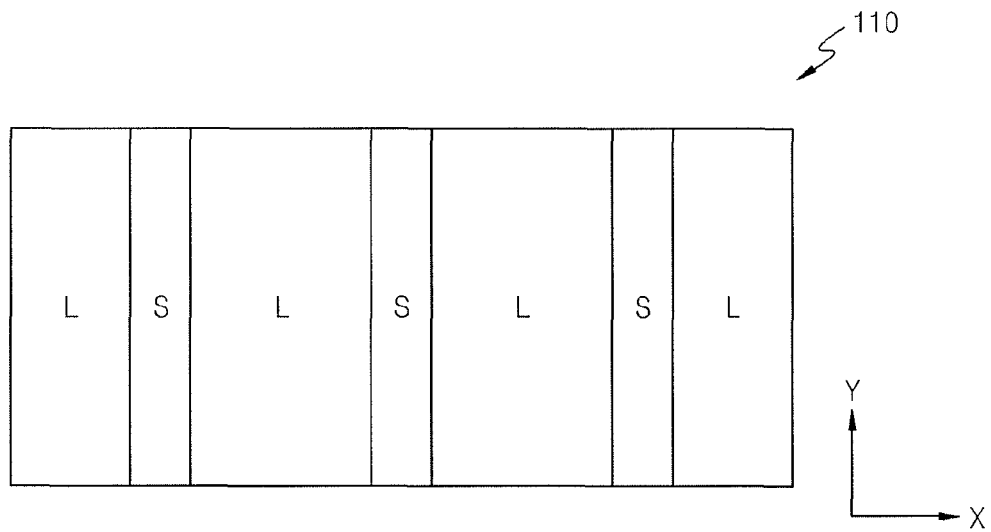

Referring to FIGS. 3, 5, and 7, a second exposure may be performed after the first exposure. The second exposure may be performed by irradiating the light 105 onto the photoresist layer 102 having been divided into the photoresist layers portions 102a and 102b by using a second mask 110 (operation S50 in FIG. 5). The second mask 110 may expose parts of the photoresist layer portions 102a and cover other parts of the photoresist layer portions 102a. For example, the second mask 110 may only expose center regions of each of the photoresist layer portions 102a. The second exposure may be performed by irradiating the light 105 onto a part of the photoresist layer portion 102a of the first exposed portion E1 in which the acid 108 is generated.

The light 105 used in the second exposure may be a KrF excimer laser (e.g., with a wavelength of about 248 nm), an ArF excimer laser (e.g., with a wavelength of about 193 nm), a $F_2$ excimer laser (e.g., with a wavelength of about 157 nm), or an EUV excimer laser (e.g., with a wavelength of about 13.5 nm). The second exposure may be performed at a second exposure dose, e.g., in several hundreds of mJ, that is greater than the first exposure dose. The second exposure dose may be performed within a range of about 100 to about 500 mJ.

During the second exposure, the photoresist layer 102 may be divided into a second exposed portion E2 and a second non-exposed portion UE2 by the second mask 110, e.g., as illustrated in FIG. 3. Due to the second exposure, the acid 108 in the photoresist layer portion 102a may be neutralized by generating a base 114 from the PBG in the second exposed portion E2, which second exposed portion E2 corresponds to a partial portion of the first exposed portion E1 (i.e., the base 114 may be generated in a part of the photoresist layer portion 102a). Since the base 114 is not generated in the second non-exposed portion UE2, the acid 108 in the second non-exposed portion UE2 may not be neutralized. Accordingly, in the second exposure the acid 108 may be partially neutralized based on the placement of the second mask 110.

The second exposed portion E2 of which the acid 108 is neutralized due to the second exposure may also become base-insoluble. In other words, the second exposed portion E2 of which the acid 108 is neutralized due to the second exposure may be formed as second photoresist image patterns 112 that are not removed even after a post process, i.e., a developing process. The second photoresist image patterns 112 may be formed to have a pitch P. The pitch P of the second photoresist image patterns 112 may be a minimum pitch that may be formed by an exposing apparatus. The pitch P of the second photoresist image patterns 112 may correspond to the pitch P of the first photoresist image patterns 106.

After the second exposure, the photoresist layer 102 may be divided into photoresist layer portions 102b (i.e., first photoresist image patterns 106), photoresist layer portions 102a that include the acid 108 (e.g., and exclude the base 114), and photoresist layer portions 102a that include the base 114 (i.e., second photoresist image patterns 112 in which the acid 108 is neutralized). The photoresist layer 102 may include the first photoresist image patterns 106, the photoresist layer portions 102a that include the acid 108, and the second photoresist image patterns 112 alternately arranged along the X-axis direction and as continuous layers along the Y-axis direction.

As illustrated in FIG. 7, the second mask 110 has a line-and-space pattern having a line pattern L and a space pattern S alternately arranged along a first direction, e.g., in an X-axis direction. Each of the line patterns L and space patterns S may be continuously formed in the Y-axis direction so as to be elongated along the Y-axis direction. During the second exposure using the second mask 110, the line pattern L indicates a portion through which the light 105 does not pass, and a space pattern S indicates a portion through which the light 105 passes. A width, e.g., the width being measured along the X-axis direction, of the line pattern L of the second mask 110 may be greater than the width of the line pattern L of the first mask 104. A width, e.g., the width being measured along the X-axis direction, of the space pattern S of the second mask 110 may be smaller than the width of the space pattern S of the first mask 104. For example, in the second mask 110, a width ratio of the line pattern L and the space pattern S may be about 3:1.

Figure 4:
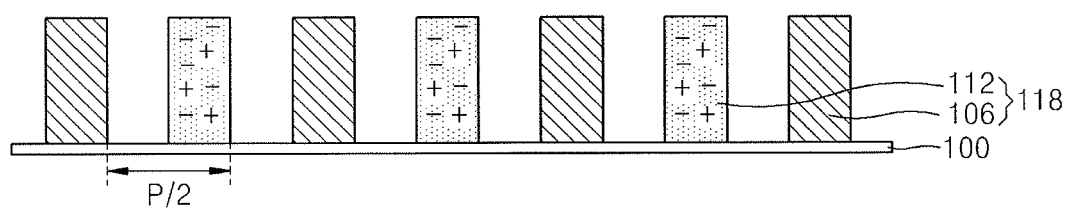
Figure 5:
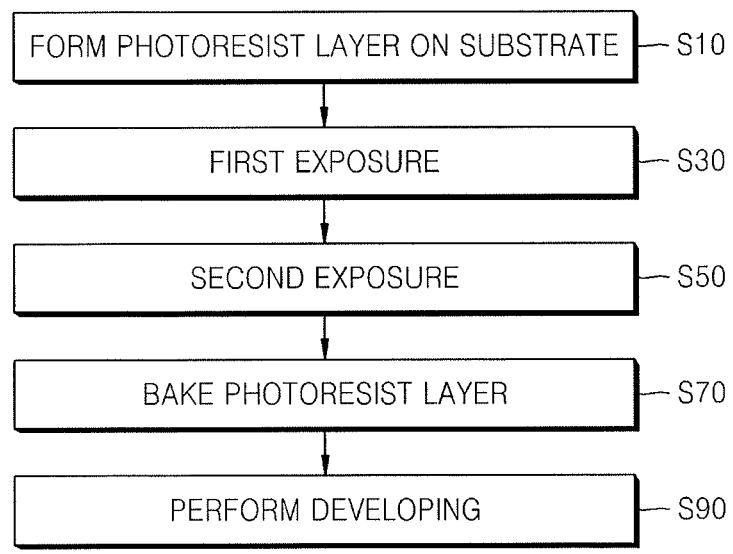
FIG. 5 illustrates a flowchart of a method of forming patterns of a semiconductor device, according to an exemplary embodiment.
Figure 6:
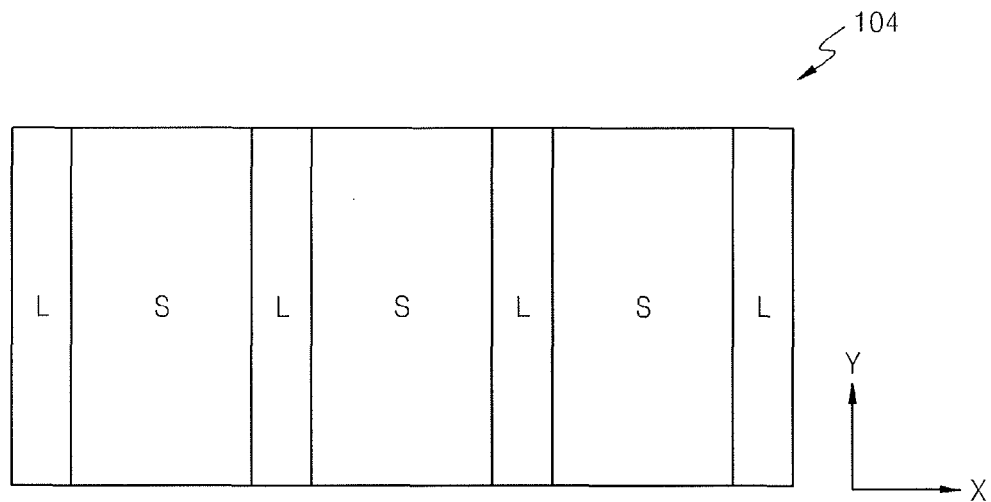
FIGS. 6 and 7 illustrate plan views of masks of FIGS. 2 and 3, respectively, which are used in exposure operations.

Referring to FIGS. 4 and 5, the photoresist layer 102 may be baked after the first and second exposures (operation S70 in FIG. 5). The baking process may be performed at a temperature between about 50° C. to about 200 ° C. Due to the baking process, the photoresist layer 102a of the first exposed portion E1 in which the acid 108 is generated may be deblocked. That is, in the baking process, the acid 108 may diffuse so that a deblocking reaction occurs in the photoresist layer 102a of the first exposed portion E1. Accordingly, base-solubility of the photoresist layer 102a in which the acid 108 was previously generated may be increased so that the photoresist layer 102a becomes base-soluble. Thus, a deblocked photoresist layer 102a may be formed.

Then, a developing process may be performed to remove the deblocked photoresist layer 102a by using a base developer (operation S90 in FIG. 5), e.g., by using tetramethylammonium hydroxide (TMAH). A concentration of TMAH in a base developer solution may be from about 2 weight % to about 5 weight % (e.g., based on 100 parts of the base developer solution). Thus, according to an exemplary embodiment, the developing process may be performed by using the base developer, and not by using an organic solvent. The base developer solution may exclude an organic solvent.

Referring to FIG. 4, by removing the deblocked photoresist layer 102a via the developing process, a photoresist pattern 118 formed of double patterns including the first photoresist image patterns 106 and the second photoresist image patterns 112 may be formed. The first photoresist image patterns 106 and the second photoresist image patterns 112 may be alternately arranged on the substrate 100 and may be spaced apart from each other.

The photoresist pattern 118 may be formed as the line-and-space pattern by using the first mask 104 and the second mask 110. The photoresist pattern 118 may have half of the minimum pitch P, i.e., a pitch of about P/2, of the first photoresist image patterns 106 and/or the second photoresist image patterns 112.

In this manner, an exemplary method of foaming patterns of a semiconductor device, may use both positive-type photoresist and the base developer and may perform a double patterning procedure via simple processes.

Figure 12:
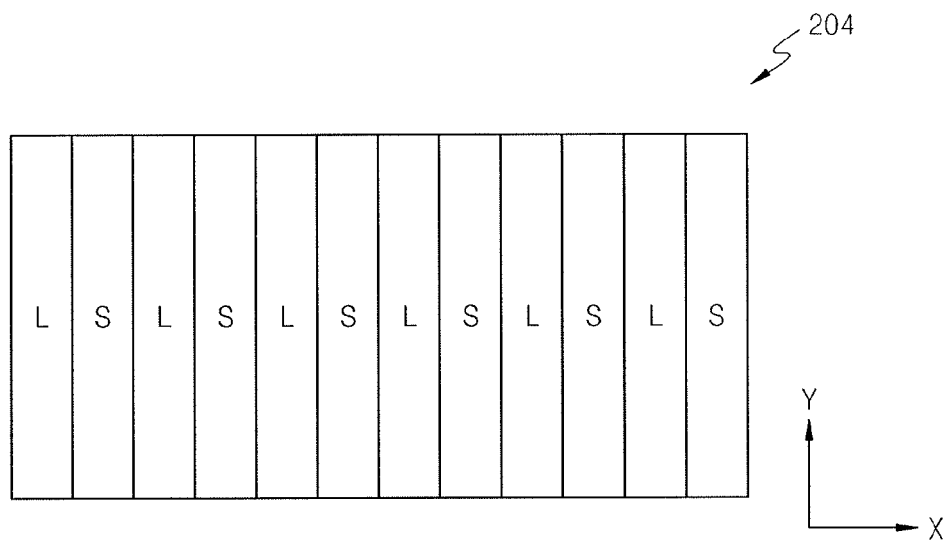
FIGS. 12 and 13 illustrate plan views of masks of FIGS. 9 and 10, respectively, that are used in exposure operations.
Figure 13:
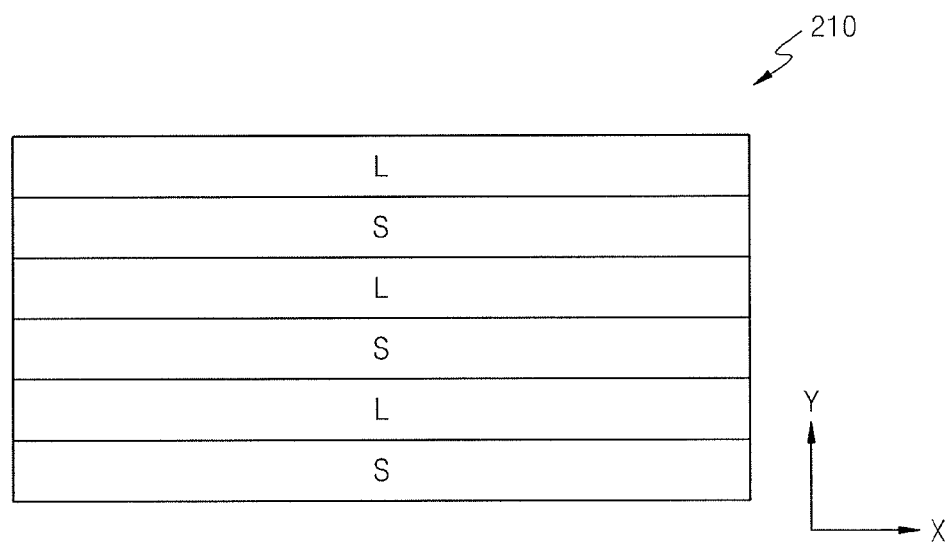

FIGS. 8 through 11 are plan views describing stages in a method of forming patterns of a semiconductor device, according to another exemplary embodiment. FIGS. 12 and 13 are plan views illustrating masks of FIGS. 9 and 10, respectively, which are used in exposures.

Compared to the embodiment of FIGS. 1 through 4, the embodiment of FIGS. 8 through 11 is substantially same except that, in the embodiment of FIGS. 8 through 11, a photoresist pattern 218 is not formed as a line-and-space pattern but is formed as a contact hole pattern having a contact hole 209, e.g., a grid pattern may be formed. In the embodiment of FIGS. 8 through 11 and the embodiment of FIGS. 1 through 4, like reference numerals denote like members.

Figure 8:
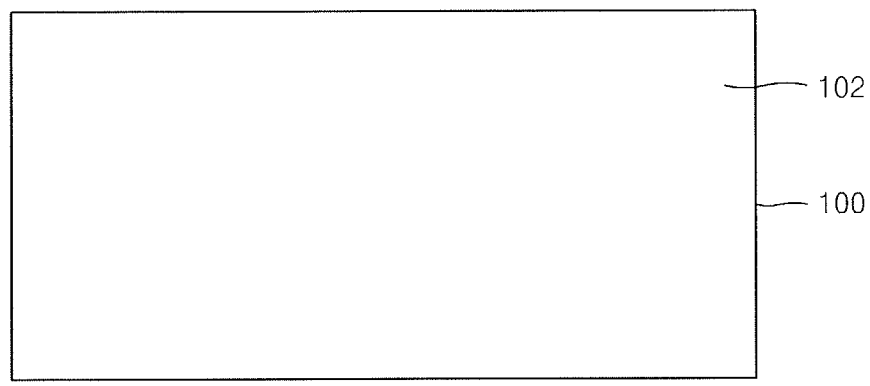
FIGS. 8 through 11 illustrate plan views depicting stages in a method of forming patterns of a semiconductor device, according to an exemplary embodiment.

Referring to FIG. 8, a photoresist layer 102 is formed on a semiconductor substrate 100. As described above, the photoresist layer 102 may include a PAG and a PBG, e.g., the PAG and the PBG may be embedded in a base material of the photoresist layer 102. Descriptions of the semiconductor substrate 100 and the photoresist layer 102 are omitted here as they have already been described above.

Figure 9:
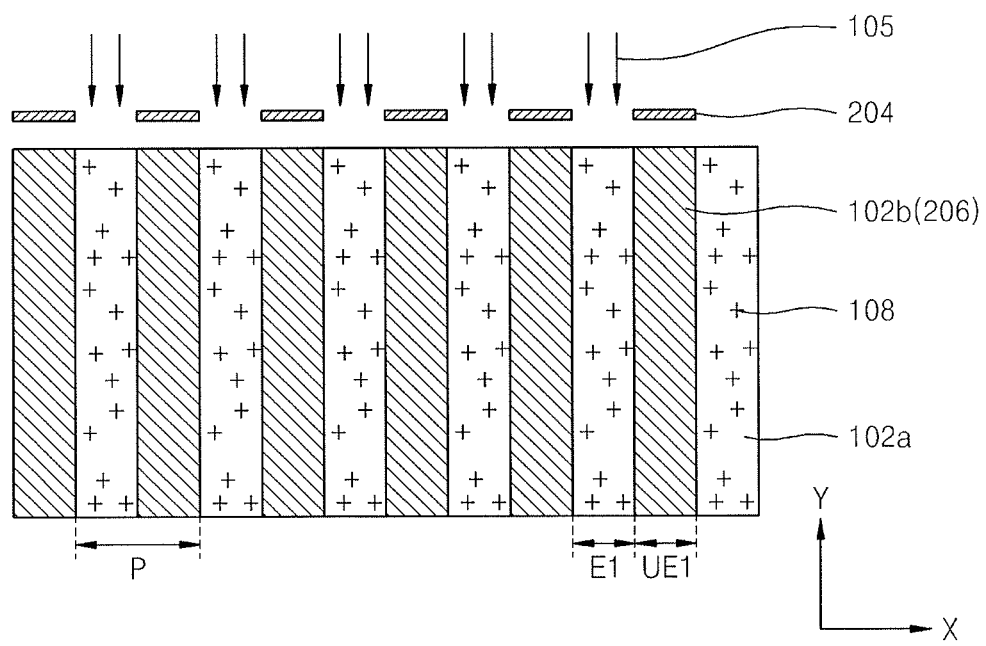

Referring to FIGS. 9 and 12, as illustrated in FIG. 12, a first exposure may be performed by irradiating light 105 onto the photoresist layer 102 by using a first mask 204 having a line-and-space pattern in a first direction, e.g., in the X-axis direction. The light 105 and an exposure dose that may be used in the first exposure may be substantially the same as those described with respect to the first exposure described above. Due to the first exposure, the photoresist layer 102 may be divided into a first exposed portion E1 and a first non-exposed portion UE1.

Due to the first exposure, an acid 108 may be generated from the PAG in a photoresist layer portion 102a of the first exposed portion E1. Since the first non-exposed portion UE1 may not be exposed, an acid (e.g., the acid 108) may not be generated in the non-exposed portion UE1. A photoresist layer portion 102b of the first non-exposed portion UE1 may become base-insoluble due to the first exposure, so that the photoresist layer 102b may be formed as first photoresist image patterns 206 that are not removed even after a post process, i.e., a developing process. The first photoresist image patterns 206 may be formed to have a pitch P in the first direction, e.g., in the X-axis direction.

The pitch P of the first photoresist image patterns 206 may be a minimum pitch that may be formed by an exposing apparatus.

In the first mask 204, a width ratio of a line pattern L and a space pattern S may be 1:1. In the first mask 204, the line pattern L indicates a portion through which the light 105 does not pass, and the space pattern S indicates a portion through which the light 105 passes during an exposure operation.

Figure 10:
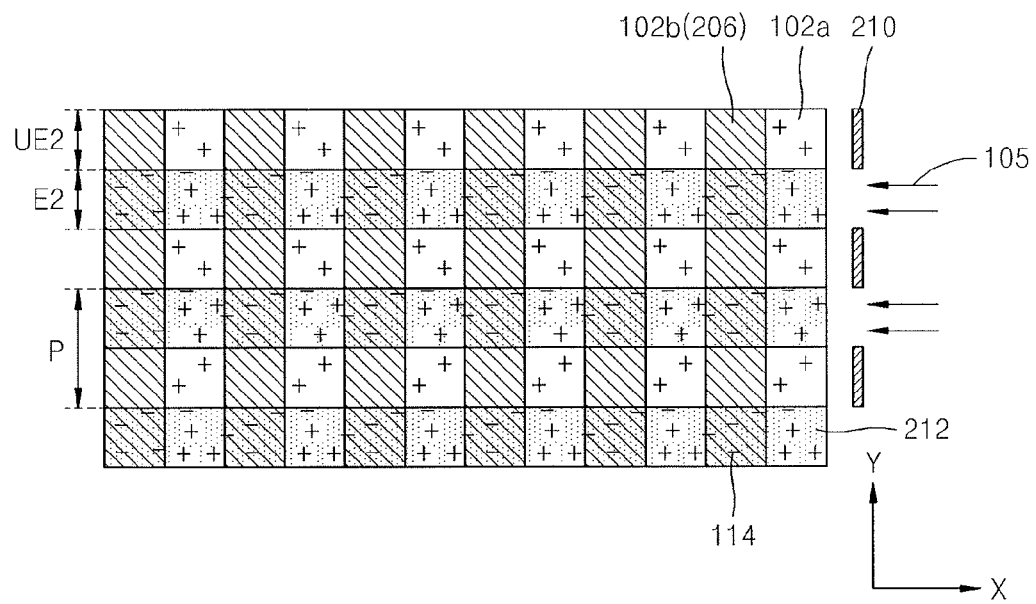

Referring to FIGS. 10 and 13, a second exposure may be performed by irradiating the light 105 onto the photoresist layer 102 by using a second mask 210 having a line-and-space pattern in a second direction, e.g., in the Y-axis direction. The second direction may be perpendicular to the first direction, e.g., as illustrated in FIG. 13. Due to the second exposure, the photoresist layer 102 may be divided into a second exposed portion E2 and a second non-exposed portion UE2. The light 105 and an exposure dose that may be used in the second exposure may be substantially the same as those of the second exposure described above.

Due to the second exposure, the acid 108 may be neutralized by generating a base 114 from the PBG in a portion of the first exposed portion E1, i.e., in a part of the photoresist layer portion 102a. The second exposed portion E2, of which the acid 108 is neutralized due to the second exposure, may become base-insoluble. Accordingly, the second exposed portion E2 may be formed as second photoresist image patterns 212 that are not removed even after a post process, i.e., a developing process. The second photoresist image patterns 212 may be formed to have a pitch P. The pitch P of the second photoresist image patterns 212 may be a minimum pitch that may be formed by an exposing apparatus.

In the second mask 210, a line pattern L indicates a portion through which the light 105 does not pass, and a space pattern S indicates a portion through which the light 105 passes during an exposure operation. In the second mask 210, a width ratio of the line pattern L and the space pattern S may be 1:1. The first mask 204 and the second mask 210 may be the same mask. That is, in the first and second exposures, if a direction of a mask mounted in the exposing apparatus is rotated by 90°, the same mask may be used as the first mask 204 and the second mask 210.

Figure 11:
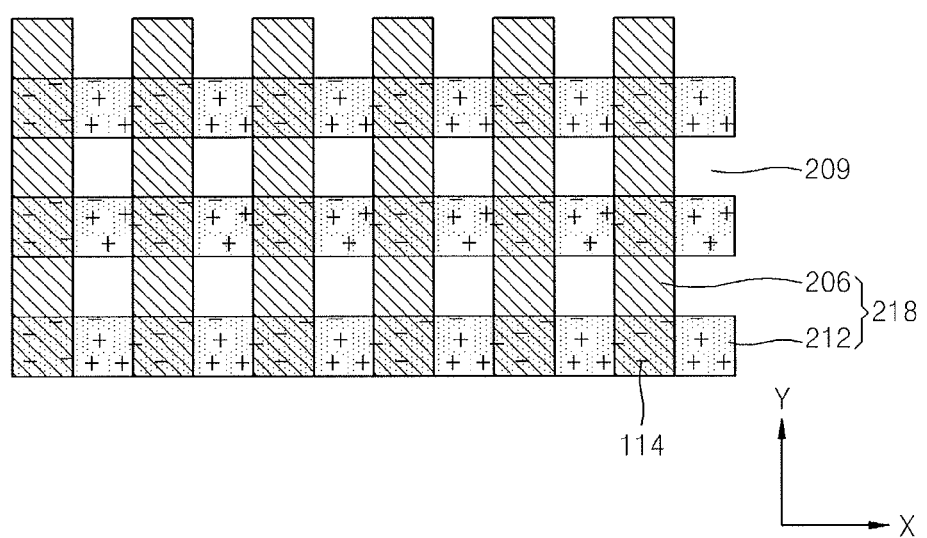

Referring to FIG. 11, as described above with reference to FIG. 4, the photoresist layer 102 may be baked after the first and second exposures, so that the photoresist layer 102a of the first exposed portion E1 in which the acid 108 is generated is deblocked. Accordingly, the base-solubility of the photoresist layer 102a in which the acid 108 was previously generated may be increased so that the photoresist layer 102a may become base-soluble.

Then, a developing process may be performed to remove the deblocked photoresist layer 102a by using a base developer, e.g., a solution including TMAH, so that the contact holes 209 may be formed. By doing so, a photoresist pattern 218, formed of double patterns including the first photoresist image patterns 206 and the second photoresist image patterns 212, may be formed. The photoresist pattern 218 may be formed as a contact hole pattern having the contact hole 209 formed therein.

Figure 14:
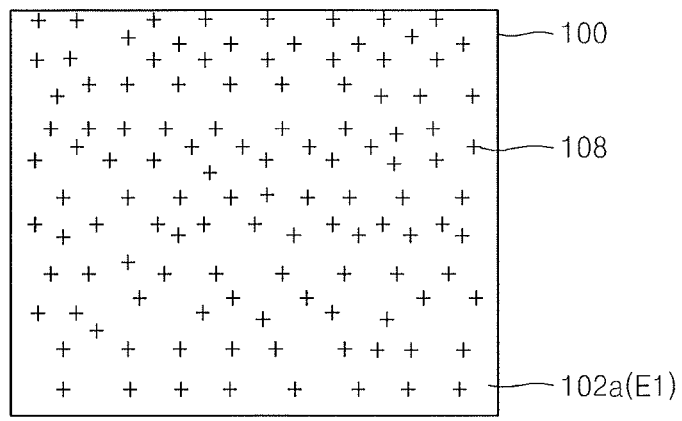
FIGS. 14 through 16 illustrate plan views depicting stages in a method of forming patterns of a semiconductor device, according to an exemplary embodiment.
Figure 15:
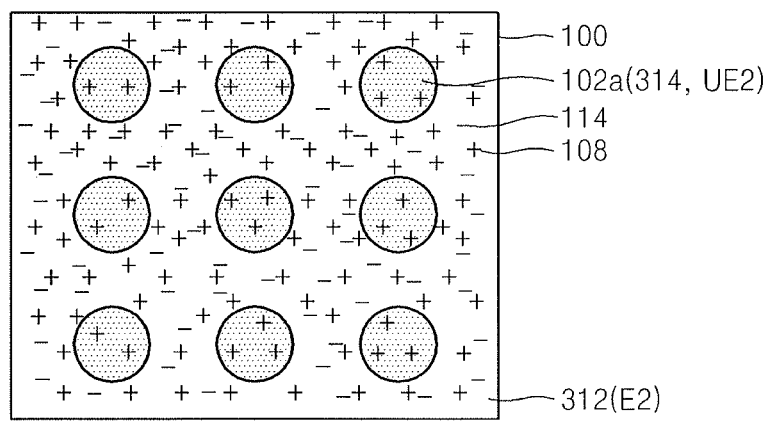
Figure 16:
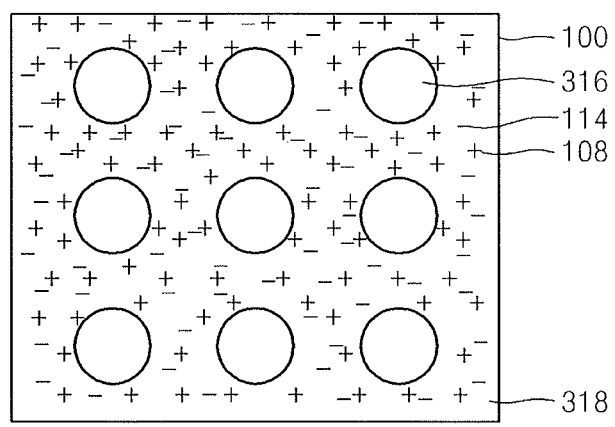
Figure 17:
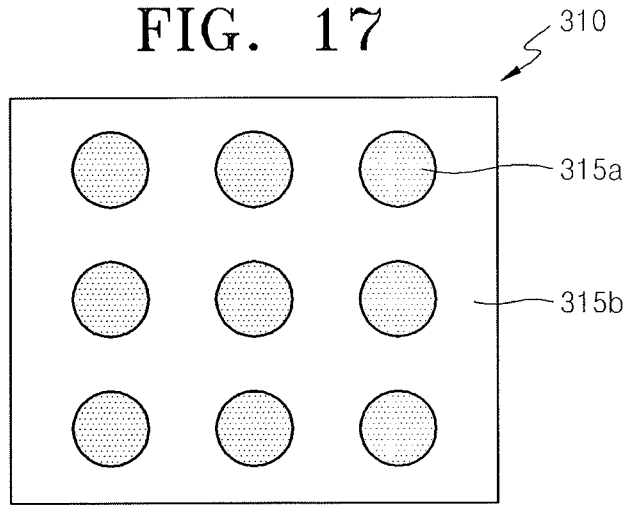
FIG. 17 illustrates a plan view of a mask of FIG. 15 that is used in an exposure operation.

FIGS. 14 through 16 are plan views depicting stages in a method of forming patterns of a semiconductor device, according to another exemplary embodiment. FIG. 17 is a plan view illustrating a mask of FIG. 15 that is used in an exposure.

Compared to the embodiment of FIGS. 8 through 11, the embodiment of FIGS. 14 through 16 is substantially the same except that, in the embodiment of FIGS. 14 through 16, a blank exposure is performed, and a photoresist pattern 318 having a contact hole 316 may be formed by using a bright field mask. In the embodiment of FIGS. 14 through 16 and the embodiment of FIGS. 8 through 11, like reference numerals denote like members.

First, as illustrated in FIG. 8, a photoresist layer 102 may be formed on a semiconductor substrate 100. As described above, the photoresist layer 102 may include a PAG and a PBG dispersed therein. Descriptions of the semiconductor substrate 100 and the photoresist layer 102 are omitted here as they have already been described above.

Referring to FIG. 14, a first exposure may be performed by the blank exposure in which light is irradiated onto an entire surface of the photoresist layer 102. After the first exposure that is a blank exposure, an acid 108 may generated from the PAG in a photoresist layer portion 102a. According to an exemplary embodiment, the acid 108 may be generated throughout the photoresist layer 102 or throughout the photoresist layer portion 102a. Accordingly, a first exposed portion E1 may indicate the entire surface of the photoresist layer portion 102a and/or the first photoresist layer 102. The light and an exposure dose that may be used in the first exposure may be the same as those described above.

Referring to FIGS. 15 and 17, after the blank exposure, a second exposure may be performed by irradiating light onto the photoresist layer 102 by using a mask 310 as shown in FIG. 17. Due to the second exposure, the photoresist layer portion 102a and/or the entire photoresist layer 102 that has been first-exposed may be divided into a second exposed portion E2 and a second non-exposed portion UE2. The light and an exposure dose that may be used in the second exposure may be the same as those described above. The non-exposed portions UE2 may be circular regions, e.g., may later form contact hole regions. The second exposed portion E2 may be a continuous region that surrounds the non-exposed portions UE2.

Due to the second exposure, the acid 108 may be neutralized in the portions surrounding the non-exposed portions UE2. The acid 108 may be neutralized by generating the base 114 from the PBG in a portion of the first exposed portion E1, i.e., in a part of the photoresist layer portion 102a. Also, due to the second exposure, a photoresist layer portion 312 that has been second-exposed and neutralized by the second exposure may be formed. Further, a photoresist image pattern 314 may be formed in the second non-exposed portion UE2. The photoresist image pattern 314 may be a contact hole image pattern.

The mask 310 of FIG. 17 may not be a dark field mask and may instead be a bright field mask 310. In the bright field mask 310, light does not pass through a small-area portion via which an image pattern is formed, and light passes through a large-area portion via which the image pattern is not formed. Compared to the bright field mask 310, the dark field mask is opposite with respect to a passage of light.

In the bright field mask 310, a contact hole mask pattern 315a indicates a portion through which light does not pass, and an adjacent portion 315b indicates a portion through which light passes. Compared to the dark field mask, the bright field mask 310 may increase light intensity. The bright field mask 310 may further improve resolution.

Referring to FIG. 16, as described above with reference to FIG. 11, the photoresist layer 102 may be baked after the first and second exposures, so that the photoresist layer portion 102a of the first exposed portion E1 in which the acid 108 is generated may be deblocked. Accordingly, base-solubility of the photoresist layer portion 102a in which the acid 108 is generated may be increased so that the photoresist layer portion 102a becomes base-soluble.

Then, a developing process may be performed to remove the deblocked photoresist layer 102a by using a base developer, e.g., TMAH, so that the contact hole 316 is formed, e.g., as illustrated in FIG. 16. By doing so, the photoresist pattern 318 having the contact hole 316 is formed. The photoresist pattern 318 is formed as a contact hole pattern having the contact hole 316 formed therein.

Figure 18:
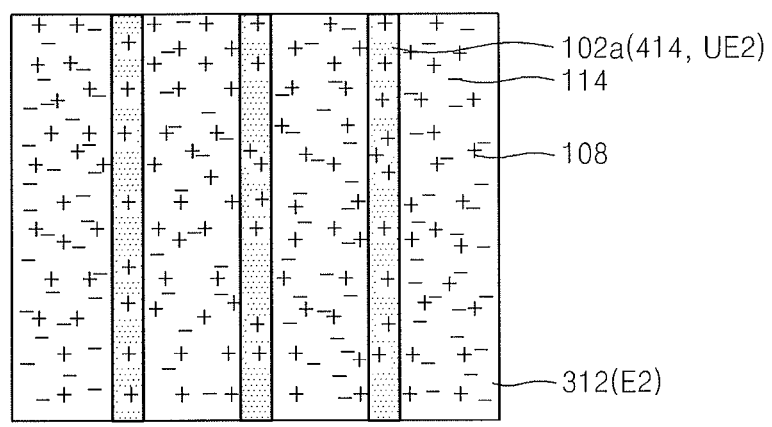
FIGS. 18 and 19 illustrate plan views depicting stages in a method of forming patterns of a semiconductor device, according to an exemplary embodiment.
Figure 19:
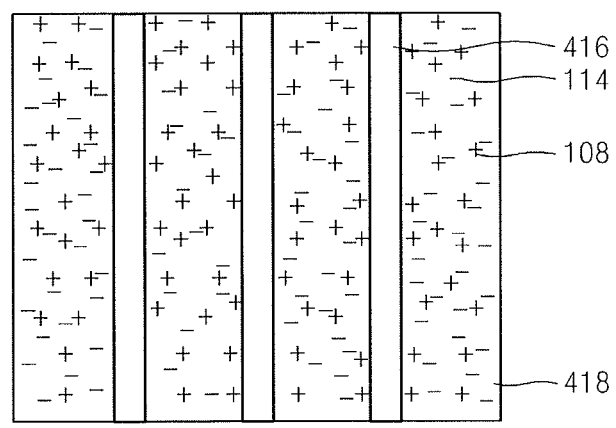
Figure 20:
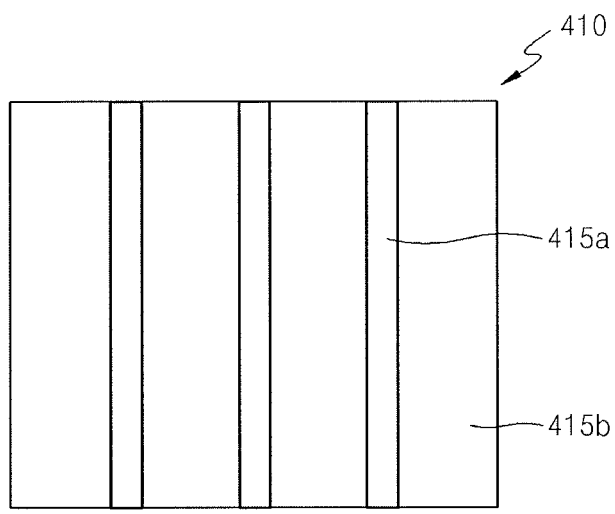
FIG. 20 illustrates a plan view of a mask of FIG. 18 that is used in an exposure operation.

FIGS. 18 and 19 are plan views depicting stages in a method of forming patterns of a semiconductor device, according to another exemplary embodiment. FIG. 20 is a plan view illustrating a mask of FIG. 18 that is used in an exposure.

Compared to the embodiment of FIGS. 14 through 16, the embodiment of FIGS. 18 and 19 is the same except that, in the embodiment of FIGS. 18 and 19, a photoresist pattern 418 having a trench may be formed. In the embodiment of FIGS. 18 and 19 and the embodiment of FIGS. 14 through 16, like reference numerals denote like members.

First, as illustrated in FIG. 8, a photoresist layer 102 may be formed on a semiconductor substrate 100. As described above, the photoresist layer 102 may include a PAG and a PBG. Descriptions of the semiconductor substrate 100 and the photoresist layer 102 are omitted here as they have already been described above.

Then, as illustrated in FIG. 14, a first exposure is performed by a blank exposure in which light is irradiated onto an entire surface of the photoresist layer 102. The light and an exposure dose that may be used in the first exposure may be substantially the same as those described above. After the first exposure, an acid 108 may be generated from the PAG in a photoresist layer portion 102a. A first exposed portion E1 may indicate the entire surface of the photoresist layer portion 102a.

Referring to FIG. 18, after the blank exposure, a second exposure is performed by irradiating light onto the photoresist layer 102 by using a mask 410 as shown in FIG. 20. Due to the second exposure, the photoresist layer portion 102a that has been first-exposed may be divided into a second exposed portion E2 and a second non-exposed portion UE2. The light and an exposure dose that may be used in the second exposure may be substantially the same as those described above.

Due to the second exposure, the acid 108 may be neutralized by generating the base 114 from the PBG in a portion of the first exposed portion E1, e.g., in a portion of the photoresist layer 102a. Also, due to the second exposure, a photoresist layer 312 that has been second-exposed and neutralized by the second exposure may be formed. A photoresist image pattern 414 may be formed in the second non-exposed portion UE2. The photoresist image pattern 414 may be a trench image pattern.

The mask 410 of FIG. 20 may not be a dark field mask and instead may be a bright field mask 410. In the bright field mask 410, light does not pass through a small-area portion via which an image pattern is formed, and light passes through a large-area portion via which the image pattern is not formed. Compared to the bright field mask 410, the dark field mask is opposite with respect to a passage of light.

In the bright field mask 410, a trench mask pattern 415a indicates a portion through which light does not pass, and an adjacent portion 415b indicates a portion through which light passes. Compared to the dark field mask, the bright field mask 410 may increase light intensity. The bright field mask 410 may further improve resolution.

Referring to FIG. 19, as described above with reference to FIG. 11, the photoresist layer 102 may be baked after the first and second exposures, so that the photoresist layer 102a of the first exposed portion E1 in which the acid 108 is generated may be deblocked. Accordingly, base-solubility of the photoresist layer 102a in which the acid 108 is generated may be increased so that the photoresist layer 102a may become base-soluble.

Then, a developing process may be performed to remove the deblocked photoresist layer 102a by using a base developer, e.g., a TMAH solution, so that the trench 416 may be formed on the substrate 100. By doing so, the photoresist pattern 418 having the trench 416 may be formed. The photoresist pattern 418 may be formed as a trench pattern having the trench 416 formed therein.

Figure 21:
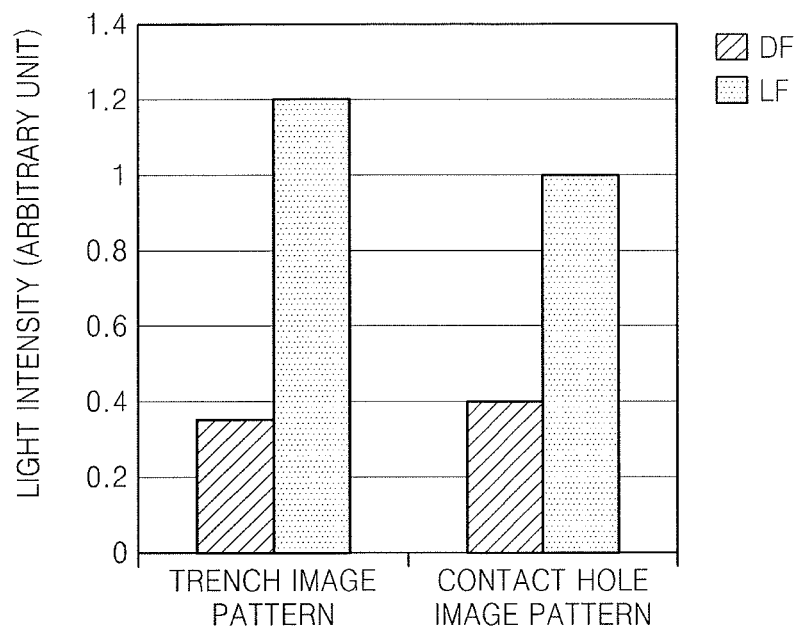
FIG. 21 illustrates a graph showing light intensities applied to masks when a contact hole image pattern of FIG. 15 and a trench image pattern of FIG. 18 are formed.

FIG. 21 is a graph showing light intensities applied to masks when the contact hole image pattern of FIG. 15 and the trench image pattern of FIG. 18 are formed.

In the graph of FIG. 21, DF indicates a dark field mask, and LF indicates a bright field mask. The graph of FIG. 21 shows the light intensities applied to the dark field mask and the bright field mask, respectively, when the contact hole image pattern of FIG. 15 and the trench image pattern of FIG. 18 are formed.

As shown in FIG. 21, it is possible to see that the light intensity applied to the bright field mask, as in the one or more exemplary embodiments, may show further improvement over when the light intensity is applied to the dark field mask. Accordingly, it is possible to further improve resolution by using the bright field mask.

FIGS. 22 through 25 are cross-sectional views depicting stages in a method of forming patterns of a semiconductor device, according to another exemplary embodiment.

For convenience of description, the method of forming patterns of a semiconductor device, according to the present exemplary embodiment, will now be described with regards to forming the line-and-space pattern of FIGS. 1 through 4. However, the method may be applied for forming other patterns, e.g., the patterns in the other exemplary embodiments.

Figure 22:
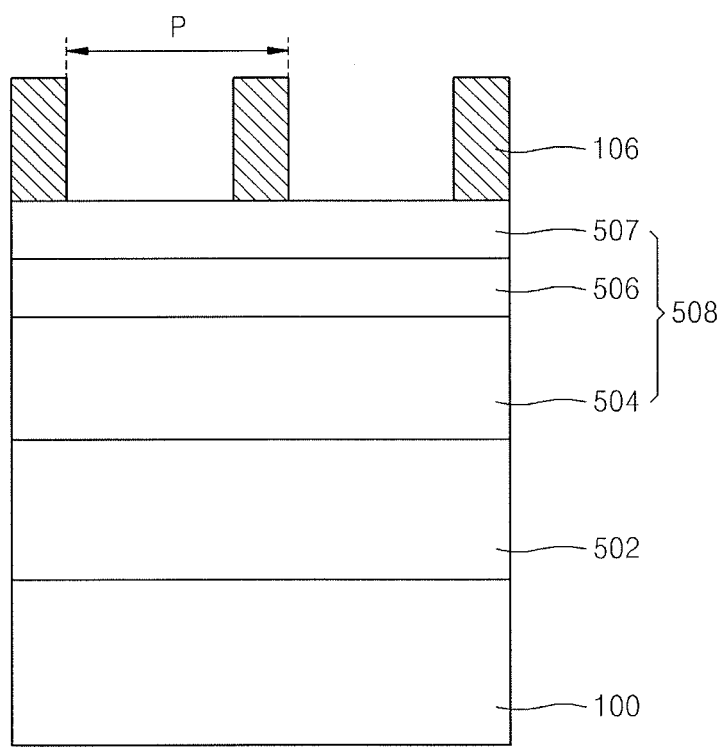
FIGS. 22 through 25 illustrate cross-sectional views depicting stages in a method of forming patterns of a semiconductor device, according to an exemplary embodiment.

Referring to FIG. 22, an etching target layer 502 is formed on the semiconductor substrate 100. The etching target layer 502 may be formed of various material according to use of a pattern to be formed. In a case where a gate electrode, i.e., a gate line, is formed on the semiconductor substrate 100, the etching target layer 502 may be formed of a conductive layer, e.g., a doped polysilicon layer, or may have a structure in which a doped polysilicon layer and a metal silicide layer are stacked. Also, in a case where a bit line is formed on the semiconductor substrate 100, the etching target layer 502 may be formed of metal, e.g., tungsten and/or aluminium.

An etching auxiliary layer 508 may be formed on the etching target layer 502. The etching auxiliary layer 508 may be formed to facilitate etching of the etching target layer 502. The etching auxiliary layer 508 may include a hard mask layer 504, a medium layer 506, and a reflection preventing layer 507. The hard mask layer 504 may be formed as an amorphous carbon layer. The medium layer 506 may be formed as, e.g., a silicon oxinitride layer. The reflection preventing layer 507 may be formed as an organic material layer.

As described with reference to FIG. 2, the first photoresist image patterns 106 are formed on the etching auxiliary layer 508 by performing a first exposure. A pitch of the first photoresist image patterns 106 may be P. The pitch P of the first photoresist image patterns 106 may have a value that is formed as small as possible by an exposing apparatus. For convenience, FIG. 22 illustrates the first photoresist image patterns 106, and a photoresist layer may be formed between the first photoresist image patterns 106 before a developing operation is performed, as described above.

Figure 23:
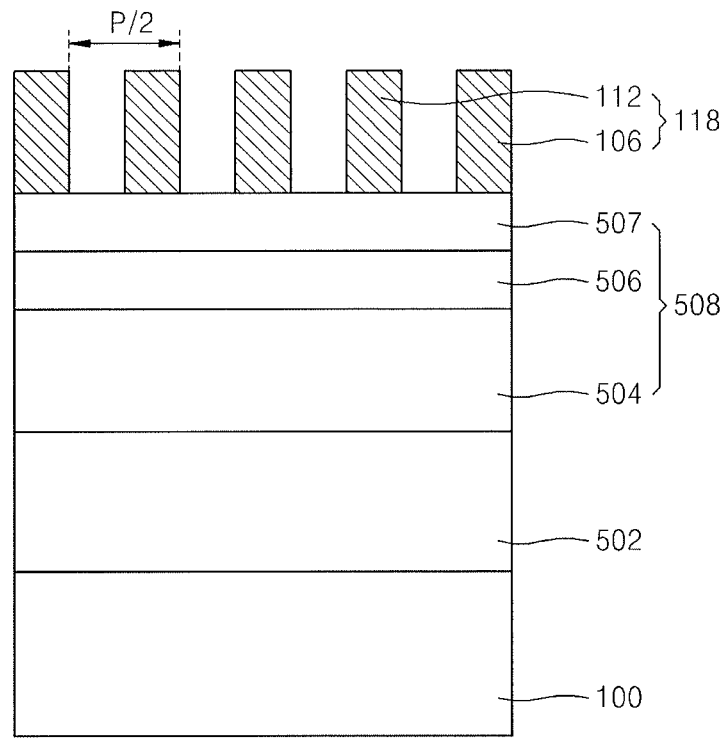

Referring to FIG. 23, as described with reference to FIG. 3, the second photoresist image patterns 112 may be formed between the first photoresist image patterns 106 by performing a second exposure. Finally, as described with reference to FIG. 4, a developing process may be performed so that photoresist patterns 118 formed of double image patterns including the first photoresist image patterns 106 and the second photoresist image patterns 112 may be formed. A pitch of the photoresist patterns 118 may be about P/2, which is a half of the pitch P of the first photoresist image patterns 106. In this manner, according to an exemplary embodiment, by performing the first exposure, the second exposure, and the developing process, without performing a complicated manufacturing procedure, the photoresist patterns 118 may be formed at a pitch of about P/2, which is half of the minimum pitch P that may be formed by the exposing apparatus.

Figure 24:
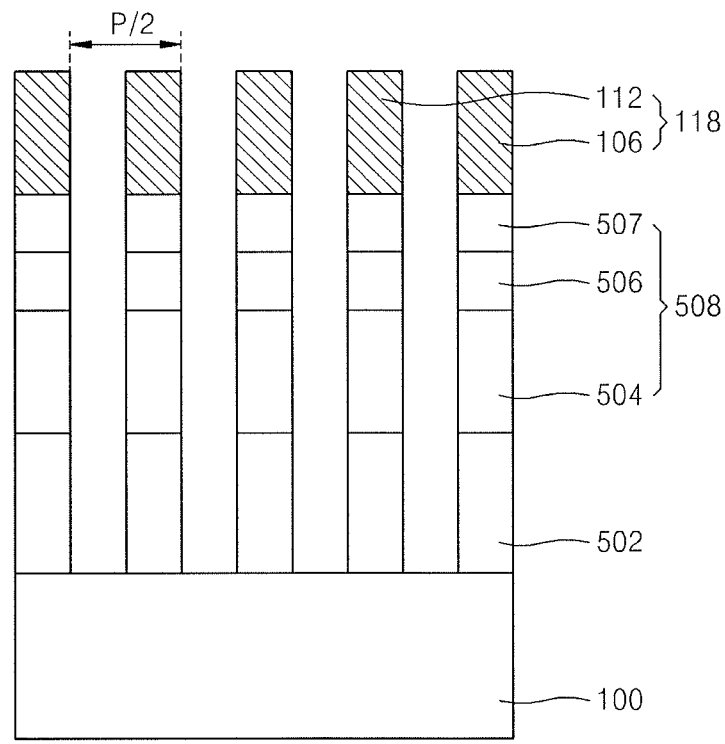

Referring to FIG. 24, the etching auxiliary layer 508 and the etching target layer 502 may be etched, e.g., at one time, by using the photoresist pattern 118 having the P/2 pitch as a mask. Sequentially, the reflection preventing layer 507 may be etched by using the photoresist pattern 118 as the mask, and then the medium layer 506, the reflection preventing layer 507, and the etching target layer 502 may be sequentially etched by using the photoresist pattern 118 and the etched reflection preventing layer 507 as masks.

Figure 25:
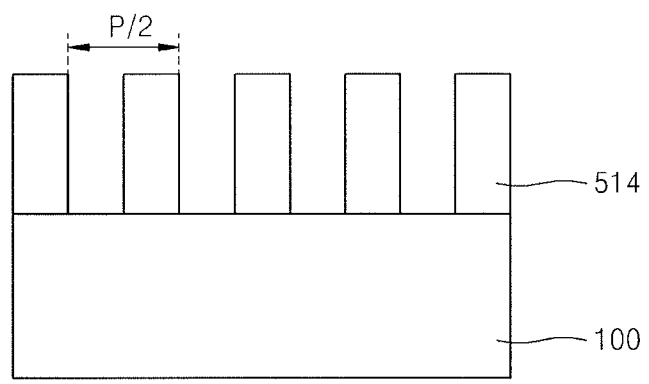

Referring to FIG. 25, after the etched photoresist pattern 118 and the etched etching auxiliary layer 508 are removed, etching patterns 514 may remain on the substrate 100. A pitch of the etching patterns 514 may be about P/2, which is the same as the pitch of the photoresist patterns 118. In this manner, according an exemplary embodiment, the photoresist pattern 118 having the P/2 pitch may be formed by performing the first and second exposures, and the etching auxiliary layer 508 and the etching target layer 502 may be etched by simply using the photoresist pattern 118 having the P/2 pitch as the mask, so that the etching patterns 514 may be formed.

By way of summation and review, when forming patterns for a semiconductor device, difficulties may occur due to resolution limits associated with using double patterning technology (DPT). In contrast, embodiments relate to a method for forming semiconductor patterns that includes using a photoresist layer having a photo acid generator (PAG) and a photo base generator (PBG). A photoresist pattern may be formed by performing first and second exposures on the photoresist layer. For example, exemplary embodiments may include an operation of neutralizing an acid by generating a base from the PBG in a second exposed portion by second-exposing a portion of a first exposed portion. Exemplary embodiments may include using a positive-type photoresist and a base developer, and a double pattering process may be performed by a simple process. Exemplary embodiments may also include methods for forming various semiconductor patterns.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming patterns of a semiconductor device, the method comprising:
   forming a photoresist layer on a substrate, the photoresist layer including a photo acid generator (PAG) and a photo base generator (PBG);
   generating an acid from the PAG in a first exposed portion of the photoresist layer by first-exposing the photoresist layer;
   generating a base from the PBG in a second exposed portion of the photoresist layer by second-exposing a part of the first exposed portion, and neutralizing the acid;
   baking the photoresist layer after the first and second-exposing and deblocking the photoresist layer of the first exposed portion in which the acid is generated to form a deblocked photoresist layer; and
   forming a photoresist pattern by removing the deblocked photoresist layer by using a developer.

2. The method as claimed in claim 1, wherein the first-exposing and the second-exposing are performed by using a first mask and a second mask, respectively, having line-and-space patterns, the photoresist pattern being formed as another line-and-space pattern.

3. The method as claimed in claim 2, wherein space patterns of the first mask and the second mask are portions through which light passes when the first-exposing and the second-exposing are performed.

4. The method as claimed in claim 2, wherein a width of a line pattern of the second mask is greater than a width of a line pattern of the first mask, and a width of a space pattern of the second mask is less than a width of a space pattern of the first mask.

5. The method as claimed in claim 1, wherein the first-exposing is performed by using a first mask having a line-and-space pattern extending along a first direction, and the second-exposing is performed by using a second mask having a line-and-space pattern extending along a second direction that is perpendicular to the first direction, the photoresist pattern being formed as a contact hole pattern.

6. The method as claimed in claim 1, wherein:
   the first-exposing is performed as a blank exposure in which an entire surface of the photoresist layer formed on the substrate is exposed, and
   the second-exposing is performed by using a bright field mask having a contact hole mask pattern, the photoresist pattern being formed as a contact hole pattern.

7. The method as claimed in claim 1, wherein:
   the first-exposing is performed as a blank exposure in which an entire surface of the photoresist layer formed on the substrate is exposed, and
   the second-exposing is performed by using a bright field mask having a trench pattern, the photoresist pattern being formed as a trench pattern.

8. The method as claimed in claim 1, wherein the photoresist layer includes a positive-type photoresist layer.

9. The method as claimed in claim 8, wherein the developer used for forming the photoresist pattern is a base developer such that the photoresist layer of the first exposed portion in which the acid is generated is removed.

10. The method as claimed in claim 1, wherein the first-exposing is performed at a first exposure dose, and the second-exposing is performed at a second exposure dose that is greater than the first exposure dose.

11. A method of forming patterns of a semiconductor device, the method comprising:
   forming an etching target layer on a substrate;
   forming a photoresist layer on the etching target layer, the photoresist layer including a photo acid generator (PAG) and a photo base generator (PBG);
   generating an acid from the PAG in a first exposed portion of the photoresist layer by first-exposing the photoresist layer, and forming first photoresist image patterns in a non-exposed portion of the photoresist layer;
   forming second photoresist image patterns by generating a base from the PBG in a second exposed portion by second-exposing a part of the first exposed portion, and neutralizing the acid;
   baking the first and second-exposed photoresist layer and deblocking the photoresist layer of the first exposed portion in which the acid is generated to form a deblocked photoresist layer;
   forming a photoresist pattern including the first photoresist image patterns and the second photoresist image patterns by removing the deblocked photoresist layer by using a developer; and
   etching the etching target layer by using the photoresist pattern as a mask.

12. The method as claimed in claim 11, wherein the first-exposing is performed at a first exposure dose, and the second-exposing is performed at a second exposure dose that is greater than the first exposure dose.

13. The method as claimed in claim 11, wherein the photoresist layer is formed as a positive-type photoresist layer, and the developer used for forming the photoresist pattern is a base developer such that the deblocked photoresist layer is removed by using the base developer.

14. The method as claimed in claim 11, wherein:
   the first photoresist image patterns are formed having a pitch P by performing the first-exposing by using a first mask having a first line-and-space pattern,
   the second photoresist image patterns are formed having the pitch P in the first photoresist image patterns by performing the second-exposing by using a second mask having a second line-and-space pattern, and
   the photoresist pattern is formed as a third line-and-space pattern having half a pitch P.

15. The method as claimed in claim 11, wherein:
   the first-exposing is performed by using a first mask having a line-and-space pattern extending along a first direction, and
   the second-exposing is performed by using a second mask having another line-and-space pattern extending along a second direction that is perpendicular to the first direction, the photoresist pattern being formed as a contact hole pattern.

16. A method of forming patterns of a semiconductor device, the method comprising:
   providing a photoresist layer including a photo acid generator (PAG) and a photo base generator (PBG);
   performing a first exposure operation on the photoresist layer to generate an acid in a first exposed portion of the photoresist layer;
   performing a second exposure operation on the photoresist layer to generate a base in a second exposed portion within the first exposed portion of the photoresist layer, the acid in the second exposed portion being neutralized during the second exposure operation;
   baking the photoresist layer after performing the first and second exposure operations to form a deblocked photoresist layer within the first exposed portion and adjacent to the second exposed portion; and
   removing the deblocked photoresist layer.

17. The method as claimed in claim 16, wherein the second exposed portion is formed within a central portion of the first exposed portion and the deblocked photoresist layer is formed on opposing sides of the second exposed portion within the first exposed portion.

18. The method as claimed in claim 16, wherein removing the deblocked photoresist layer includes using a base developer that includes tetramethylammonium hydroxide.

19. The method as claimed in claim 16, wherein performing the first exposure operation includes using a first mask that overlaps a first non-exposed portion of the photoresist layer and performing the second exposure operation includes using a second mask that overlaps a second non-exposed portion of the photoresist layer, the second non-exposed portion being larger than the first non-exposed portion.

20. The method as claimed in claim 19, wherein after removing the deblocked photoresist layer, the first non-exposed portion of the photoresist layer and the second exposed portion of the photoresist layer remain.

* * * * *